United States Patent
Chang (10) Patent No.: US 6,359,370 B1
(45) Date of Patent: Mar. 19, 2002

(54) PIEZOELECTRIC MULTIPLE DEGREE OF FREEDOM ACTUATOR

(75) Inventor: Timothy N. Chang, Pompton Plains, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 0 days.

(21) Appl. No.: 08/999,809

(22) Filed: Nov. 26, 1997

Related U.S. Application Data (63) Continuation of application No. 08/396,144, filed on Feb. 28, 1995, now abandoned.

(51) Int. Cl.$^7$ ............................................. H01L 41/08
(52) U.S. Cl. ...................... 310/328; 310/330; 310/331; 310/367
(58) Field of Search ...................... 310/328, 330–331, 310/366, 367, 368

(56) References Cited

U.S. PATENT DOCUMENTS

| | | | |
|---|---|---|---|
| 3,304,773 A | * 2/1967 | Rogallo ................... | 310/331 X |
| 3,928,778 A | * 12/1975 | Ivanov et al. ............... | 310/331 |
| 4,678,955 A | * 7/1987 | Toda ........................... | 310/328 |
| 4,686,440 A | * 8/1987 | Hatamura et al. ...... | 310/331 X |
| 4,798,989 A | 1/1989 | Miyazaki .................... | 310/328 |
| 4,877,957 A | 10/1989 | Okada et al. ............... | 250/306 |
| 4,944,580 A | 7/1990 | MacDonald et al. ........ | 350/611 |
| 5,043,621 A | 8/1991 | Culp .......................... | 310/316 |
| 5,170,089 A | * 12/1992 | Fulton ........................ | 310/328 |
| 5,252,884 A | * 10/1993 | Dona .......................... | 310/328 |
| 5,705,878 A | * 1/1998 | Lewis ..................... | 310/331 X |

FOREIGN PATENT DOCUMENTS

| | | | |
|---|---|---|---|
| JP | 0266882 | * 11/1987 | ................. 310/331 |

* cited by examiner

*Primary Examiner*—Mark O. Budd
(74) *Attorney, Agent, or Firm*—Klauber & Jackson (57) ABSTRACT

A piezoelectric actuator that is capable of providing up to six degrees of positioning freedom. Specifically, the piezoelectric actuator is capable of providing positioning freedom in three linear directions (x, y, z) and three rotary angles ($\phi$, $\theta$, $\psi$). The piezoelectric actuator typically comprises a plurality of unit cells stacked on top of one another. Each unit cell comprises a base plate, a cruciform base, and a stack of piezoelectric plates. The base plate is used to support the cruciform base. The cruciform base comprises a piezoelectric cruciform-shaped body, a plurality of electrodes formed on the top surface of the cruciform-shaped body, and a ground plane formed on the bottom surface of the cruciform-shaped body. Each piezoelectric plate in the stack of piezoelectric plates comprises a piezoelectric plate body, a plurality of electrodes formed on the top surface of the plate body, and a ground plane formed on the bottom surface of the plate body. The piezoelectric plates are bonded together and to the cruciform base. Motion (linear or angular) is generated by applying suitable drive voltages to the electrodes.

16 Claims, 8 Drawing Sheets

PIEZOELECTRIC MULTIPLE DEGREE OF FREEDOM ACTUATOR

This application is a continuation of application Ser. No. 08/396,144, filed Feb. 28, 1995 now abn.

FIELD OF THE INVENTION

The present invention relates generally to piezoelectric actuators and, more particularly, to a piezoelectric actuator capable of providing multiple degree of freedom positioning.

DESCRIPTION OF THE PRIOR ART

Piezoelectric actuators have long been used to adjust the position of various objects. In fact, piezoelectric actuators that position various objects have been the subject of several prior patents. For example, U.S. Pat. No. 5,043,621 to Culp, U.S. Pat. No. 4,877,957 to Okada et al., U.S. Pat. No. 4,798,989 to Miyazaki et al., and U.S. Pat. No. 4,944,580 to MacDonald et al. are all directed toward either piezoelectric actuators alone or devices employing piezoelectric actuators for the positioning thereof. A brief description of these patents will now be given.

In U.S. Pat. No. 5,043,621, Culp discloses a piezoelectric shear device comprising at least one piezoelectric shear actuator having X, Y, and Z translation shear piezoelectric portions arranged in a pyramidal stack between a support means and a positionable object. Electric potentials applied to the X, Y, and Z translation shear piezoelectric portions cause the stack to translate in three orthogonal directions. It should be noted that this patent emphasizes a pyramidal stack structure for the piezoelectric shear device.

In U.S. Pat. No. 4,877,957, Okada et al. disclose a pair of piezoelectric actuators each comprising a plurality of cube-shaped electrodes and cube-shaped piezoelectric members alternately arranged in the form of a matrix with leg portions projecting outward from the four corners and the center of the matrix. The distal ends of the leg portions projecting from the four corners of the matrix are fixed to a mounting plate, while a scanning probe holding member of a scanning type tunnel microscope is mounted on the distal end of the leg portion projecting from the center of the matrix. When electric potentials are applied to the electrodes, and hence to the piezoelectric members, the piezoelectric actuator adjusts the position of the scanning probe holding member in three orthogonal directions. It should be noted that this patent emphasizes a cube-type matrix structure for the piezoelectric actuators.

In U.S. Pat. No. 4,798,989, Miyazaki et al. disclose a piezoelectric actuator assembly comprising X-direction and Y-direction piezoelectric elements disposed, along with movable blocks, between fixed blocks located at four corners on a base. The piezoelectric actuator assembly also comprises Z-direction piezoelectric elements disposed on the movable blocks. When electric potentials are applied to the piezoelectric elements, the piezoelectric actuator assembly adjusts the position of a probe of a scanning tunneling microscope in three orthogonal directions. It should be noted that this patent emphasizes a fixed and movable block construction for the piezoelectric actuator assembly.

In U.S. Pat. No. 4,944,580, MacDonald et al. disclose a plurality of cylindrical piezoelectric drivers each comprising an annular piezoelectric tube having an inner electrode surface and at least at least three control electrodes positioned axially on the outside surface area. Each piezoelectric driver is positioned between a mirror substrate and a mounting block. Electric potentials are applied to the control electrodes so as to adjust the tilt, tip, and piston of the mirror substrate. It should be noted that this patent emphasizes an annular construction for the piezoelectric drivers.

While all of the above-described patents are directed toward either piezoelectric actuators alone or devices employing piezoelectric actuators for positioning, none are directed toward a piezoelectric actuator that is capable of providing up to six degrees of positioning freedom. Specifically, none of the above-described patents are directed toward a piezoelectric actuator that is capable of providing positioning freedom in three linear directions (x, y, z) and three rotary angles ($\phi$, $\theta$, $\psi$). Such a piezoelectric actuator would understandably be desirable in those instances were both linear and rotary positioning is required. Thus, it would be both novel and desirable to provide such a piezoelectric actuator.

SUMMARY OF THE INVENTION

The present invention contemplates a piezoelectric actuator that is capable of providing up to six degrees of positioning freedom. Specifically, the piezoelectric actuator is capable of providing positioning freedom in three linear directions (x, y, z) and three rotary angles ($\phi$, $\theta$, $\psi$).

The piezoelectric actuator typically comprises a plurality of unit cells stacked on top of one another. Each unit cell typically comprises a base plate, a cruciform base, and a stack of piezoelectric plates. The base plate is fabricated of rigid, non-piezoelectric materials and is used to support the cruciform base. The cruciform base is fabricated of piezoelectric materials and is typically constructed by removing four square corners from a single large piezoelectric plate so as to achieve a cruciform shape which fits within the base plate. The stack of piezoelectric plates typically comprises a plurality of square piezoelectric plates bonded together and to the cruciform base.

The cruciform base and the each of the plurality of square piezoelectric plates in the stack have electrodes formed therein or deposited thereon, and motion (linear or angular) is generated by applying suitable drive voltages to the electrodes.

Accordingly, the primary objective of the present invention is to provide a piezoelectric actuator that is capable of providing up to six degrees of positioning freedom.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention, reference is now be made to the appended drawings. The drawings should not be construed as limiting the present invention, but are intended to be exemplary only.

PRINCIPLE OF THE PRESENT INVENTION

The present invention is based on the piezoelectric properties of a number of natural/synthetic crystals or ceramics such as lead zirconate/lead titanate (PZT) or barium titanate. It is well known that piezoelectric materials exhibit mechanical deformation when an electric field is applied. Specifically, for a piezoelectric plate polarized in the z-axis direction, an electric field applied parallel to the z-axis direction results in the following dimensional changes:

$$\Delta x = \frac{d_{31} L}{T} V$$

$$\Delta y = \frac{d_{31} W}{T} V$$

$$\Delta z = d_{33} V$$

where L, W, and T are, respectively, the length (along the x-axis), the width (along the y-axis) and the thickness (along the z-axis) of the plate. Furthermore, V is an applied voltage, and $d_{33}$ and $d_{31}$ are piezoelectric voltage constants.

The pressure produced by the deformation is given by:

$$P_x = P_y = d_{31} V / T Y_{11}$$

$$P_z = d_{33} V / T Y_{11}$$

where $Y_{11}$ is the Young's modulus. The typical values of $d_{31}$, $d_{33}$, and $Y_{11}$ are $-250 \times 10^{-12}$ m/V, $500 \times 10^{-12}$ m/V, and $6 \times 10^{10}$ N/m², respectively. The maximum applied voltage is typically 1 kV/mm thickness.

PREFERRED EMBODIMENT OF THE PRESENT INVENTION

Figure 1:
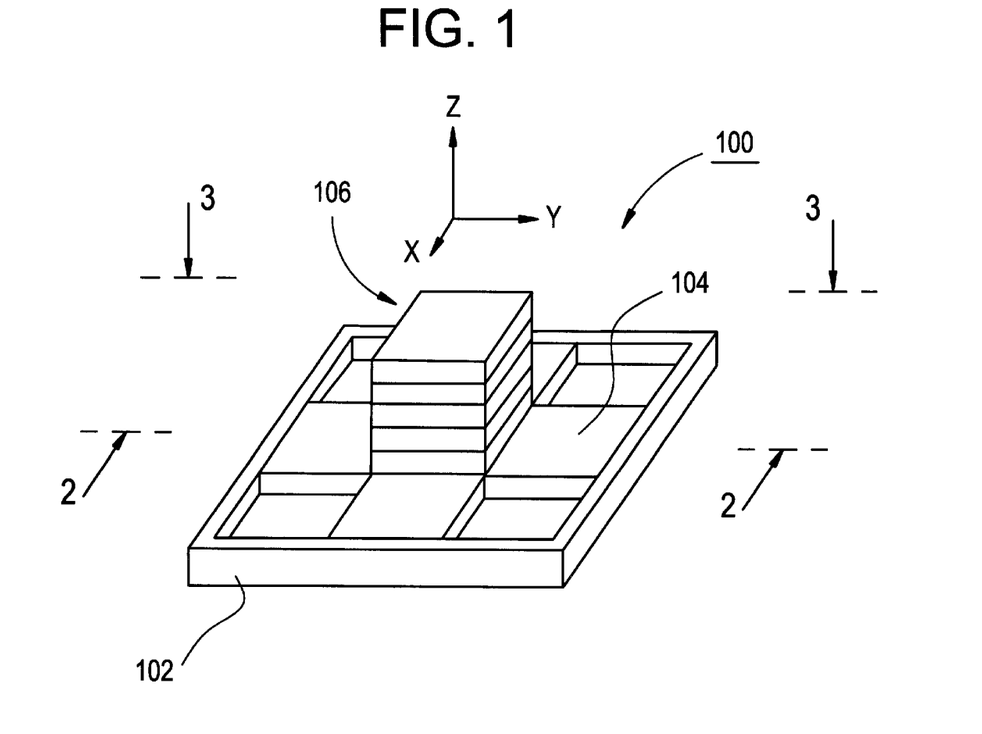
FIG. 1 is a three-dimensional view of a unit cell of a piezoelectric actuator according to the present invention.
Figure 2:
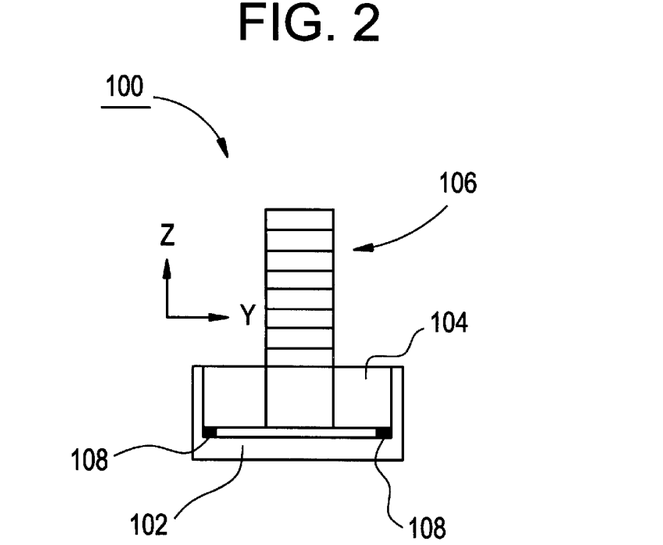
FIG. 2 is a cross-sectional side view of the unit cell shown in FIG. 1 taken along line 2—2 of FIG. 1.
Figure 3:
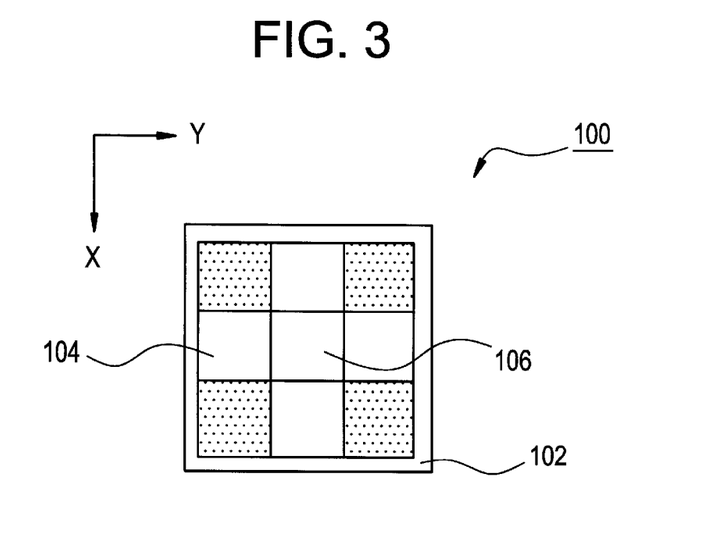
FIG. 3 is a top view of the unit cell shown in FIG. 1 taken along line 3—3 of FIG. 1.

Referring to FIGS. 1–3, there is shown a unit cell 100 of a piezoelectric actuator according to the present invention. The unit cell 100 comprises a base plate 102, a cruciform base 104, and a stack of piezoelectric plates 106.

Figure 4:
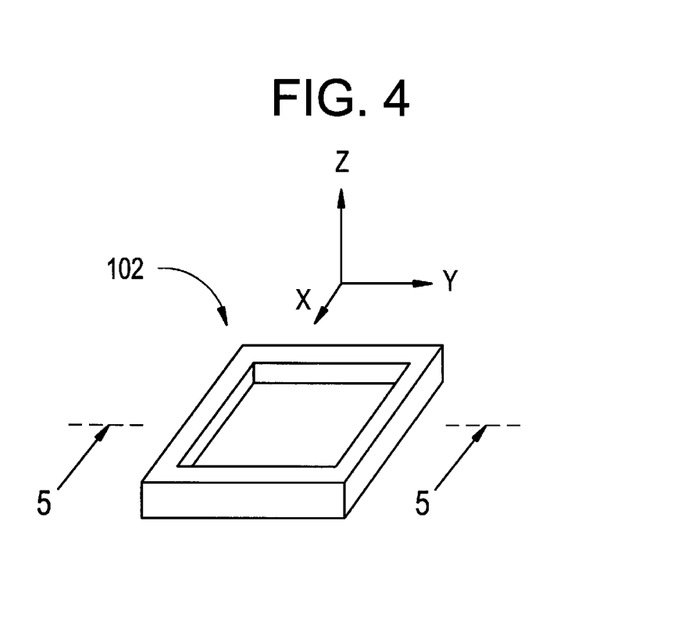
FIG. 4 is a three-dimensional view of the base plate of the unit cell shown in FIG. 1.
Figure 5:
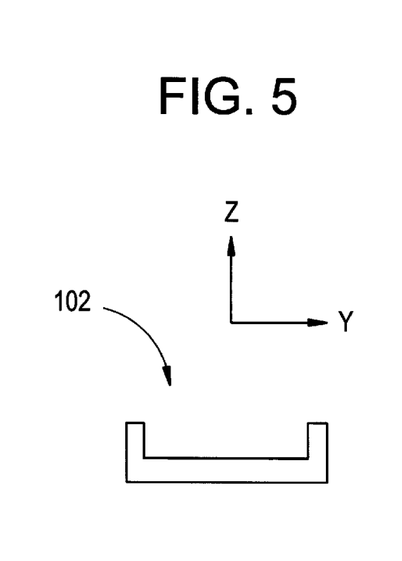
FIG. 5 is a cross-sectional side view of the base plate shown in FIG. 4 taken along line 5—5 of FIG. 4.

Referring to FIGS. 4 and 5, there is shown the base plate 102 of the unit cell 100. The base plate 102 functions as a support for the cruciform base 104, which in turn supports the stack of piezoelectric plates 106. The base plate 102 is shown having a lidless, box-like shape, although the base plate 102 may have other shapes so long as the cruciform base 104 is supported laterally, and, as described below, along its underside. The base plate 102 is fabricated of rigid, non-piezoelectric materials such as invar, copper, or zerodur.

Referring specifically to FIG. 2, the cruciform base 104 is shown bonded to the base plate 102 along its underside. The bonds 108 are made with an insulating adhesive, such as epoxy, so as to electrically isolate the cruciform base 104 from the base plate 102.

Figure 6:
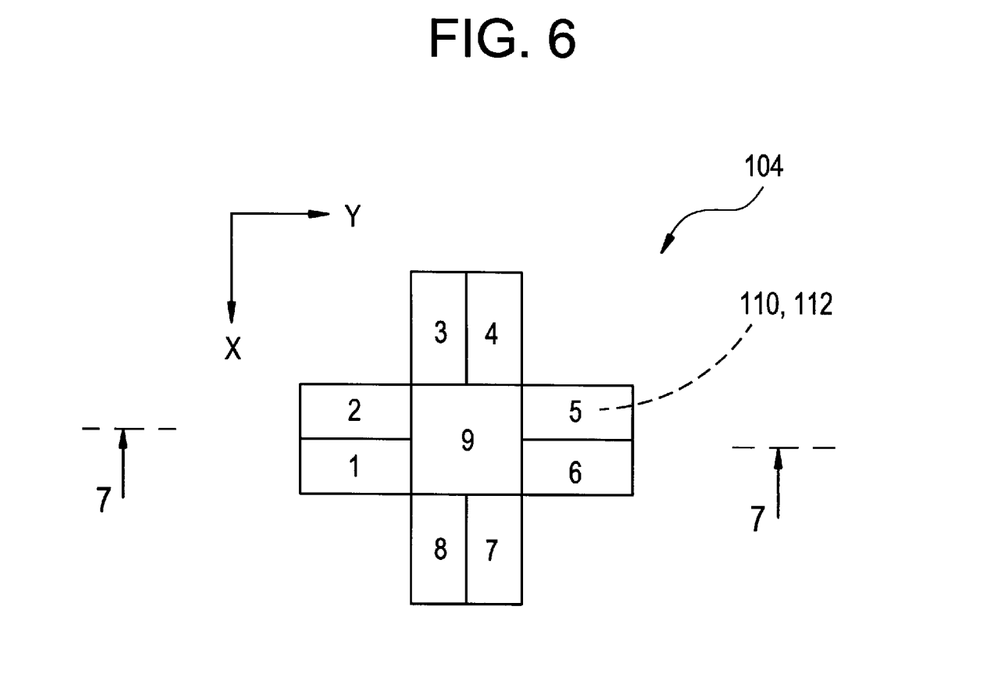
FIG. 6 is a top view of the cruciform base of the unit cell shown in FIG. 1.
Figure 7:
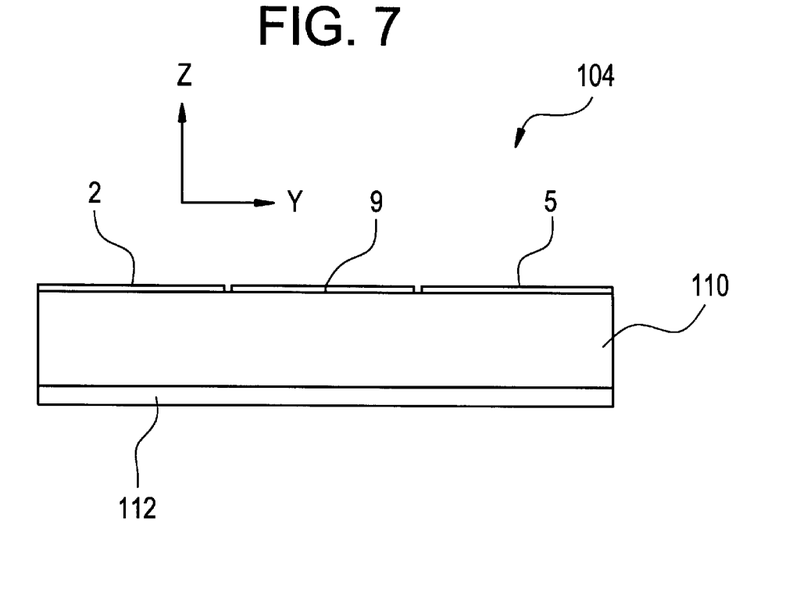
FIG. 7 is a cross-sectional side view of the cruciform base shown in FIG. 6 taken along line 7—7 of FIG. 6.

Referring to FIGS. 6 and 7, there is shown the cruciform base 104 of the unit cell 100. The cruciform base 104 comprises a piezoelectric cruciform-shaped body 110, a plurality of electrodes 1–9 formed on the top surface of the cruciform-shaped body 110, and a ground plane 112 formed on the bottom surface of the cruciform-shaped body 110. The cruciform-shaped body 110 may be constructed from a single piezoelectric plate (i.e. by directly molding the cruciform-shaped body or by removing the four square corners of a square piezoelectric plate), as shown, or a plurality of piezoelectric plates which are bonded together.

The plurality of electrodes 1–9 are formed by depositing an electrically conductive material, such as silver, onto to the top surface of the cruciform-shaped body 110 and then etching out the individual electrodes 1–9 by a known industrial process. Of course, if the cruciform-shaped body 110 is constructed from a plurality of piezoelectric plates, then the etching process would not be required. In the present invention, electrodes 1–8 are used to deform the cruciform-shaped body 110, while electrode 9 functions as a sensor.

Similar to the electrodes 1–9, the ground plane 112 is formed by depositing an electrically conductive material, such as silver, onto to the bottom surface of the cruciform-shaped body 110. Unlike the electrodes 1–9, the ground plane 112 uniformly covers the entire bottom surface of the cruciform-shaped body 110.

Figure 8:
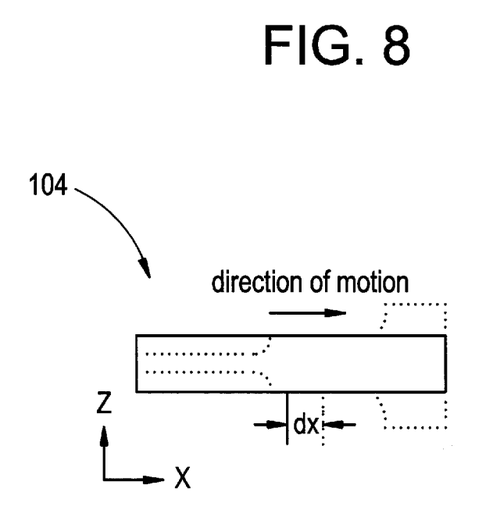
FIG. 8 shows the geometric deformation of the cruciform base in the x-axis direction.

The center of the cruciform-shaped body 110 may be moved linearly in the x-axis and y-axis directions and angularly in the φ-direction (i.e. around the z-axis) by applying suitable drive voltages between the electrodes 1–8 and the ground plane 112. For example, linear motion in the x-axis direction is generated by applying a voltage $V_x$ to electrodes 3 and 4 while simultaneously applying an opposite voltage $-V_x$ to electrodes 7 and 8. Referring to FIG. 8, there is shown the geometric deformation of the cruciform-shaped body 110 in the x-axis direction as a result of applying the aforesaid voltages. The resultant net displacement in the x-axis direction is given by:

$$\Delta x = d_{31} L / T V_x$$

where L and T are the length and thickness of the cruciform-shaped body 110, respectively. As an example of the magnitude of the net displacement, for L=1 cm, T=1 mm, $d_{31} = -250 \times 10^{-12}$ m/V, and $V_x = 100$V, the linear displacement is 0.25 microns.

Similar to the linear motion in the x-axis direction, linear motion in the y-axis direction is generated by applying a voltage $V_y$ to electrodes 1 and 2 and an opposite voltage $-V_y$ to electrodes 5 and 6. The resultant net displacement in the y-axis direction is given by:

$$\Delta y = d_{31} L / T V_y$$

where L and T are the length and thickness of the cruciform-shaped body 110, respectively.

It should be noted that no angular motion is induced with respect to the center of the cruciform-shaped body 110 as a result of the linear motion in the x-axis and y-axis directions due to the symmetry of the geometric deformation. It should also be noted that linear motion in both the x-axis and y-axis directions may be generated by applying the principle of superposition.

Figure 9:
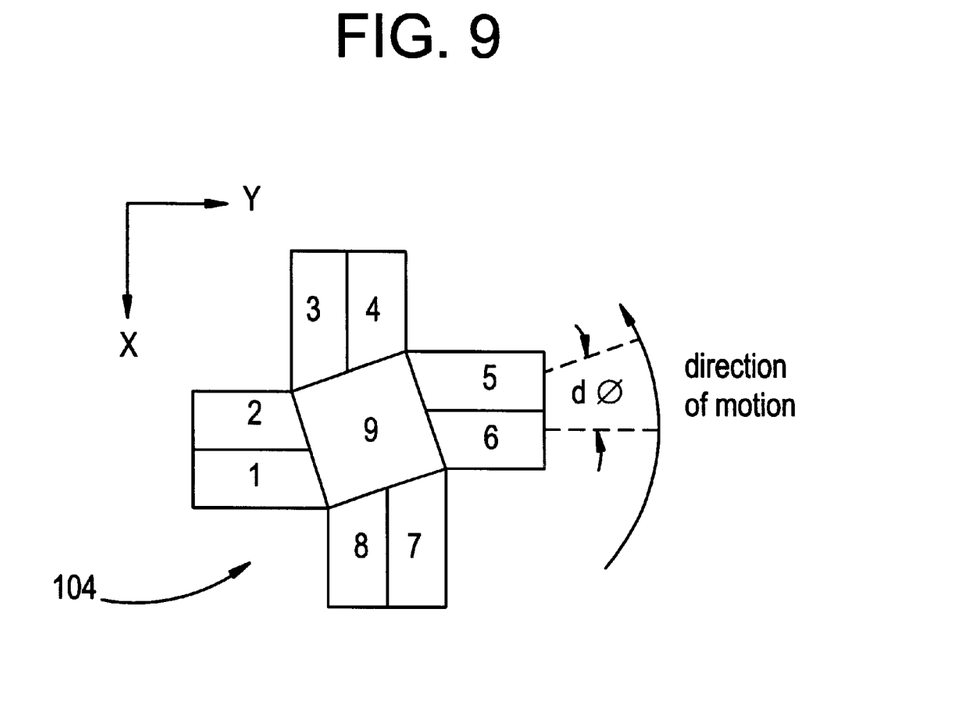
FIG. 9 shows the geometric deformation of the cruciform base in the φ-direction.

Angular motion in the φ-direction (i.e. around the z-axis) is generated by applying a voltage $V_{100}$ to electrodes 1, 3, 5 and 7 and an opposite voltage $-V_{100}$ to electrodes 2, 4, 6 and 8. Referring to FIG. 9, there is shown the geometric deformation of the cruciform-shaped body 110 in the φ-direction as a result of applying the aforesaid voltages. The resultant angle of rotation in the φ-direction, in radians, is given by:

$$\phi = \frac{\Delta}{L} = \frac{2d_{31}}{T}V_\phi$$

where $\Delta=2\Delta x=2\Delta y$ and T is the thickness of the cruciform-shaped body 110. As an example of the magnitude of the angle of rotation, for T=1 mm, $d_{31}=-250\times10^{-12}$m/V, and $V_{100}=100$V, the angle of rotation is 50 micro-radians or 0.17 arc-minutes.

It should be noted that no net linear motion is induced with respect to the center of the cruciform-shaped body 110 as a result of the angular motion in the φ-direction due to the symmetry of the geometric deformation.

Figure 10:
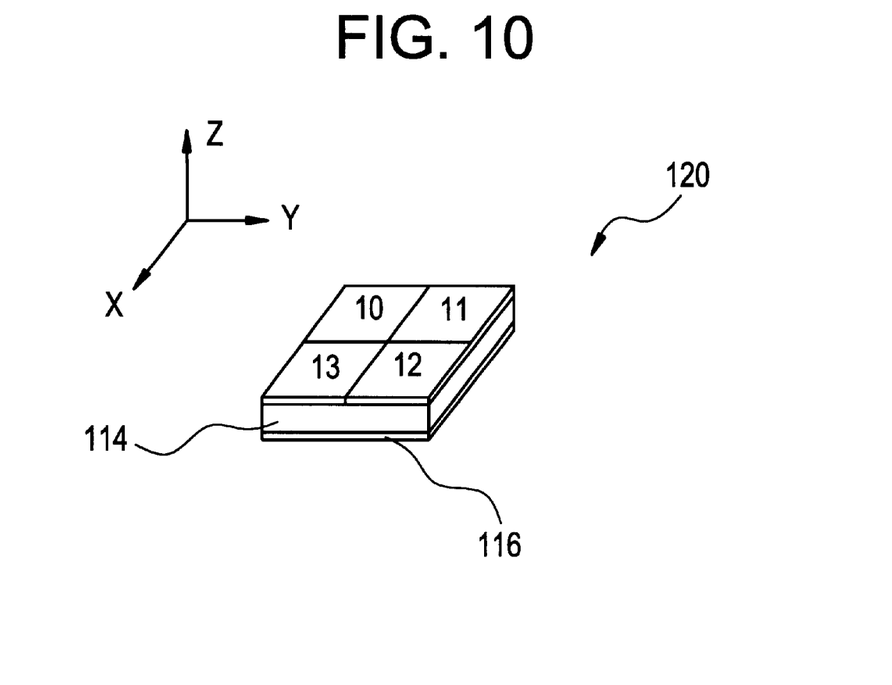
FIG. 10 is a three-dimensional view of one of the piezoelectric plates in the stack of piezoelectric plates of the unit cell shown in FIG. 1.

Referring to FIG. 10, there is shown a three-dimensional view of a representative one 120 of the piezoelectric plates in the stack of piezoelectric plates 106 of the unit cell 100. Each piezoelectric plate in the stack of piezoelectric plates 106 comprises a piezoelectric plate body 114, a plurality of electrodes 10–13 formed on the top surface of the plate body 114, and a ground plane 116 formed on the bottom surface of the plate body 114. The plate body 114 may be constructed of a single piezoelectric plate, as shown, or a plurality of piezoelectric plates which are bonded together.

The plurality of electrodes 10–13 are formed by depositing an electrically conductive material, such as silver, onto to the top surface of the plate body 114 and then etching out the individual electrodes 10–13 by a known industrial process. Of course, if the plate body 114 is constructed from a plurality of piezoelectric plates, then the etching process would not be required. In the present invention, electrodes 10–13 are used to deform the plate body 114.

Similar to the electrodes 10–13, the ground plane 116 is formed by depositing an electrically conductive material, such as silver, onto to the bottom surface of the plate body 114. Unlike the electrodes 10–13, the ground plane 116 uniformly covers the entire bottom surface of the plate body 110.

Figure 11:
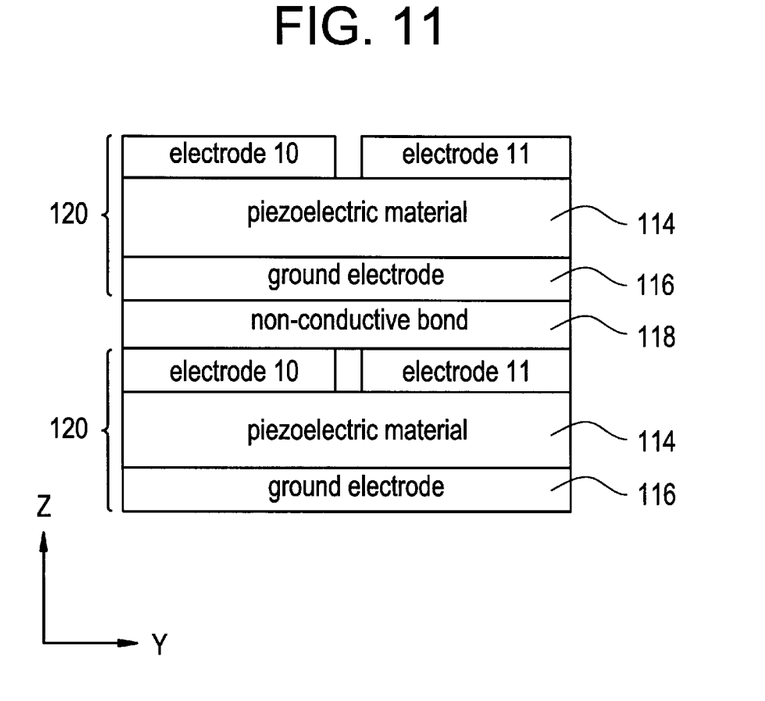
FIG. 11 is a cross-sectional side view of two piezoelectric plates in the stack of piezoelectric plates of the unit cell shown in FIG. 1.

Referring to FIG. 11, there is shown a cross-sectional side view of two of the piezoelectric plates 120 in the stack of piezoelectric plates 106 of the unit cell 100. The two piezoelectric plates 120 are bonded together with an insulating adhesive, such as epoxy, so as to electrically isolate the ground plane 116 of the upper piezoelectric plate 120 from the electrodes 10–13 of the lower piezoelectric plate 120. This bonding arrangement is typical of the bonding arrangement between all of the piezoelectric plates 120 in the stack of piezoelectric plates 106 of the unit cell 100. Thus, the stack of piezoelectric plates 106 typically comprises m piezoelectric plates 120 bonded together by an insulating adhesive. It should be noted that a similar bonding arrangement is effected between the stack of piezoelectric plates 106 and the cruciform base 104 (i.e. the bottom of the stack of piezoelectric plates 106 is bonded to the top of the cruciform base 104).

Figure 12:
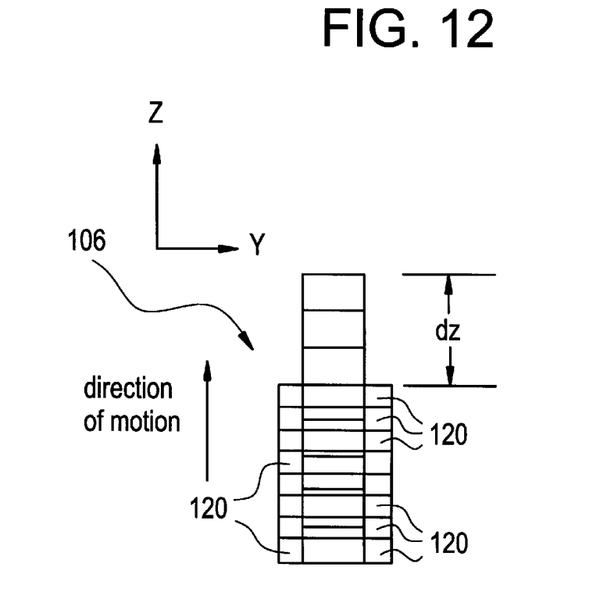
FIG. 12 shows the geometric deformation of the stack of piezoelectric plates in the z-axis direction.

The stack of piezoelectric plates 106 may be moved linearly in the z-axis direction and angularly in the θ- and ψ-directions (i.e. around the x-axis and y-axis, respectively) by applying suitable drive voltages between the electrodes 10–13 and the ground plane 116. For example, linear motion in the z-axis direction is generated by applying a voltage $V_z$ to electrodes 10, 11, 12, and 13. Referring to FIG. 12, there is shown the geometric deformation of the stack of piezoelectric plates 106 in the z-axis direction as a result of applying the aforesaid voltage. The resultant net displacement in the z-axis direction is given by:

$$\Delta z = m d_{33} V_z$$

As an example of the magnitude of the net displacement, for m=10, $d_{33}=500\times10^{-12}$m/V, and $V_z=100$V, the linear displacement is 0.5 microns per cell.

Again, no angular motion is induced with respect to the stack of piezoelectric plates 106 as a result of the linear motion in the z-axis direction due to the symmetry of the geometric deformation.

Figure 13:
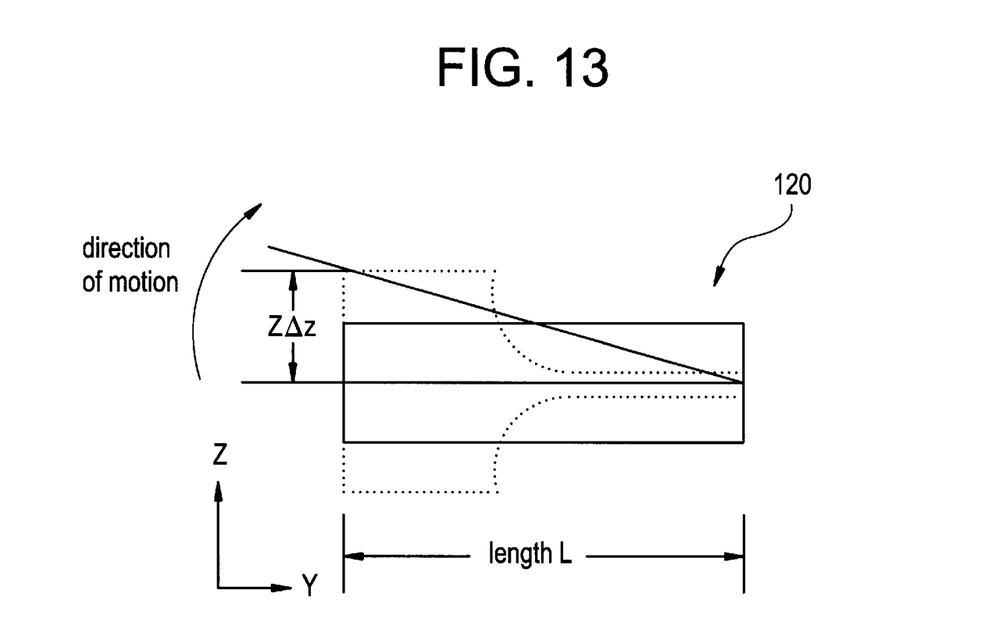
FIG. 13 shows the geometric deformation of one of the piezoelectric plates in the θ-direction.
Figure 14:
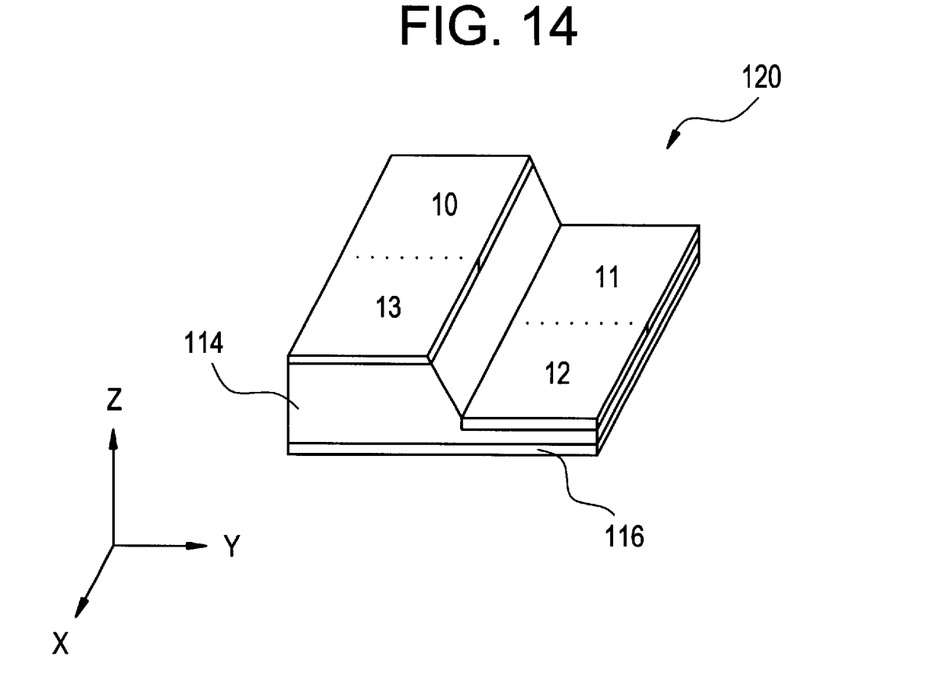
FIG. 14 is a three-dimensional view of one of the piezoelectric plates in a deformed state.

Angular motion in the θ-direction (i.e. around the x-axis) is generated by applying a voltage $V_\theta$ to electrodes 10 and 13 and an opposite voltage $-V_\theta$ to electrodes 11 and 12. Referring to FIG. 13, there is shown the geometric deformation of one of the piezoelectric plates 120 in the θ-direction as a result of applying the aforesaid voltages. Accordingly, the resultant angle of rotation of the stack of piezoelectric plates 106 in the θ-direction, in radians, is given by:

$$\theta = \frac{2m\Delta z}{L} = \frac{2md_{33}}{L}V_\theta$$

where L is the length of the piezoelectric plates 120. As an example of the magnitude of the angle of rotation, for L=1 cm, $d_{33}=500\times10^{-12}$m/V, m=10, and $V_\theta=100$, the angle of rotation is 0.34 arc minutes per cell. FIG. 14 is a three-dimensional view of one of the piezoelectric plates 120 in a deformed state.

Similar to the angular motion in the θ-direction, angular motion in the ψ-direction (i.e. around the y-axis) is generated by applying a voltage $V_{104}$ to electrodes 10 and 11 and an opposite voltage $-V_{104}$ to electrodes 12 and 13. Accordingly, the resultant angle of rotation of the stack of piezoelectric plates 106 in the ψ-direction, in radians, is given by:

$$\psi = \frac{2m\Delta z}{L} = \frac{2md_{33}}{L}V_\psi$$

where L is the length of the piezoelectric plates 120.

Again, no net linear motion is induced with respect to the stack of piezoelectric plates 106 as a result of the angular motion in the θ- and ψ-directions due to the symmetry of the geometric deformation.

The voltage-electrode relationships corresponding to the six degrees of positioning freedom are summarized below in Table 1.

TABLE 1

| Drive Voltage | Motion Direction | Positive Electrodes | Opposite Electrodes |
|---|---|---|---|
| $V_x$ | x linear | 3, 4 | 7, 8 |
| $V_y$ | y linear | 1, 2 | 5, 6 |
| $V_z$ | z linear | 10, 11, 12, 13 | none |
| $V_\theta$ | θ angular | 10, 13 | 11, 12 |
| $V_\psi$ | ψ angular | 10, 11 | 12, 13 |
| $V_\phi$ | φ angular | 1, 3, 5, 7 | 2, 4, 6, 8 |

The motion resulting from the applied voltages produces linear force and angular torque. The pressure produced in the x-axis and y-axis directions is given by:

$$P_x = d_{31} Y_{11} \frac{V_x}{T}$$

and $$P_y = d_{31} Y_{11} \frac{V_y}{T}$$

As an example of the magnitude of the pressure produced in the x-axis direction, for $Y_{11}=6\times10^{10}$ N/m$^2$, T=1 mm, and $V_x$=100V, the pressure generated is $1.5\times10^6$N/m$^2$. The equivalent force over a 1 cm by 1 mm surface is 15N.

Similarly, the pressure produced in the z-axis direction is given by:

$$P_z = d_{33} \frac{V_z}{T}$$

which is about $3\times10^6$N/m$^2$ when $V_z$=100V. The equivalent force over an 1 cm by 1 cm area is 300N.

The torques produced in the φ, θ, and ψ directions are therefore 6N–m, 3N—m, and 3N—m, respectively.

Figure 15:
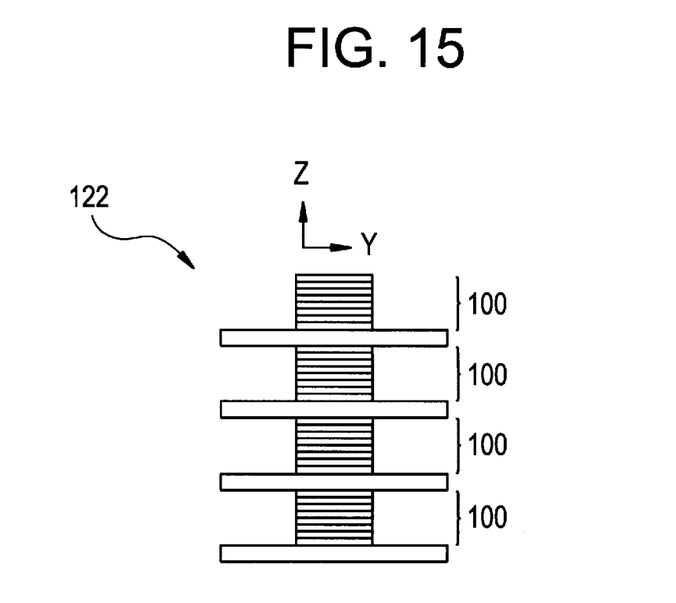
FIG. 15 is a side view of a piezoelectric actuator according to the present invention.

Referring to FIG. 15, there is shown a piezoelectric actuator 122 according to the present invention. This particular piezoelectric actuator 122 comprises four unit cells 100 which are bonded together axially (i.e. along the z-axis). It should be noted, however, that any reasonable number of unit cells 100 (n number) may be axially bonded together so as to form a similar piezoelectric actuator according to the present invention.

Typically, corresponding electrodes are wired so as to be electrically connected, except, of course, for the sensor electrodes 9, which are generally wired separately. That is, electrode 1 on all of the cruciform bases 104 are electrically connected, electrode 10 on all of the piezoelectric plates 120 are electrically connected, and so on. The ground planes 112,116 are also electrically connected. This wiring scheme simplifies the overall wiring of the piezoelectric actuator 122 and conforms with the typical use of the piezoelectric actuator 122 since motion (linear or angular) is typically generated using all of one particular electrode or all of a select group of electrodes.

Figure 16:
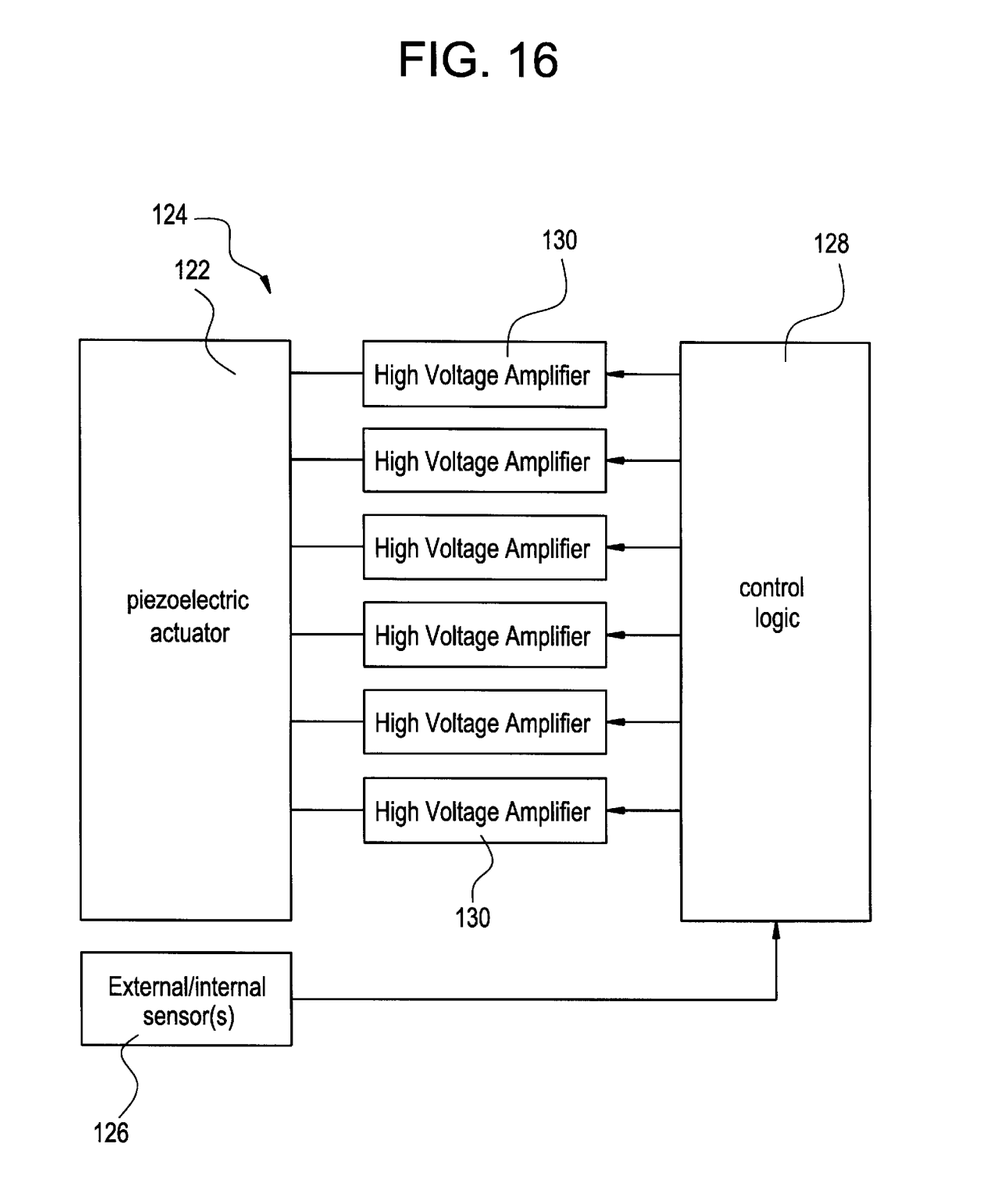
FIG. 16 is a schematic diagram of a piezoelectric actuator system according to the present invention.

Referring to FIG. 16, there is shown a schematic diagram of a piezoelectric actuator system 124 according to the present invention. The piezoelectric actuator system 124 comprises the piezoelectric actuator 122, internal/external motion/position sensor(s) 126, control logic 128, and a plurality of high voltage amplifiers 130. The internal/external motion/position sensor(s) 126 may comprise the sensor electrodes 9 and/or a variety of external sensors such as an interferometer, a Fotonic sensor, or a capacitive pick-up sensor. These external sensors detect low frequency movement and are often required since the sensor electrodes 9 are often dedicated to detecting high frequency movement as well as ambient vibration. The internal/external motion/position sensor(s) 126 provide feedback signals to the control logic 128.

The control logic 128, which may be implemented in either analog or digital form, receives feedback from the sensor(s) 126 and generates drive signals for the plurality of high voltage amplifiers 130. The plurality of high voltage amplifiers 130, in turn, provide drive signals to the electrodes in the piezoelectric actuator 122. Typically, there is one high voltage amplifier 130 for each degree of motion. In this particular case, the six high voltage amplifiers 130 correspond to, and supply, the six drive voltages $V_x$, $V_y$, $V_z$, $V_{74}$, $V_{104}$, $V_{100}$. It should be noted that the plurality of high voltage amplifiers 130 typically contain filters for filtering the drive signals.

At this point it should be noted that a simpler embodiment of a piezoelectric actuator according to the present invention, which is capable of providing positioning freedom in three linear directions (x, y, z), may be realized by combining electrodes 1 and 2 into a single electrode, electrodes 3 and 4 into a single electrode, electrodes 5 and 6 into a single electrode, electrodes 7 and 8 into a single electrode, and electrodes 10, 11, 12, and 13 into a single electrode. Furthermore, it should be noted that the hub of the cruciform-shaped body 110 may be circular in shape, or it may have any number of shapes, and that there may be more or less than four limbs extending radially outward from the hub.

With the present invention piezoelectric actuator system 124 now fully described, it can thus be seen that the primary objective set forth above is efficiently attained and, since certain changes may be made in the above-described piezoelectric actuator system 124 without departing from the scope of the invention, it is intended that all matter contained in the above description or shown in the accompanying drawings shall be interpreted as illustrative and not in a limiting sense.

What is claimed is:

1. A piezoelectric actuator capable of providing multiple degree of freedom positioning in linear and angular directions, said piezoelectric actuator comprising:
    a base actuator fabricated of piezoelectric material and generally disposed in an x–y plane, said base actuator having a first surface facing in a positive z-direction and orthogonal to the x–y plane and a second surface facing in a negative z-direction and orthogonal to the x–y plane, said base actuator being shaped to define a center hub with a plurality of pairs of limb members extending radially outward therefrom, each said limb member of each said pair of limb members being disposed on opposite sides of said hub from its paired member, each said first surface and each said second surface of said limb members having electrically conductive material deposited thereon, thereby forming at least one electrode area on said first surface of each said limb members, and thereby forming a ground electrode area on said second surface of each said limb member; and
    a base unit for supporting the outer radial ends of said plurality of limb members;
        wherein said electrode areas are capable of being selectively electrified to cause at least a portion of each limb member of at least one of said pairs of limb members to move in an opposite direction within the x–y plane from at least a portion of its paired member, thereby causing said center hub to move in a predetermined direction.

2. The piezoelectric actuator according to claim 1 wherein said base actuator is of monolithic construction.

3. The piezoelectric actuator according to claim 1 wherein said at least one electrode area on said first surface of each said limb member is comprised of first and second discrete radially partitioned electrode areas.

4. The piezoelectric actuator according to claim 3 wherein all of said limb members are comprised of said first and second discrete radially separated electrode areas, and wherein said hub rotates within the x–y plane about the z-axis upon the application of a first polarity voltage to each of said first discrete electrode areas and the simultaneous application of a second polarity voltage to each of said second discrete electrode areas, said first and second voltages being opposite to each other.

5. The piezoelectric actuator according to claim 3 wherein the application of a first polarity voltage to both said first and second discrete electrode areas on one limb member of one of said pairs of limb members and the simultaneous application of a second polarity voltage, which is opposite to said first polarity, to both said first and second discrete electrode areas on the other of said one of said pairs of limb members, causes said hub to translate within the x–y plane along a line intersecting said one of said pairs of limb members.

6. The piezoelectric actuator according to claim 1 further comprising:
   a plate actuator including a plate body fabricated of piezoelectric material, said plate body having a first surface facing in the positive z-direction and a second surface facing in the negative z-direction, said first surface and said second surface having electrically conductive material deposited thereon, thereby forming at least one electrode area on said first surface and at least one ground electrode on said second surface, wherein said second surface of said plate body is secured to but electrically isolated from said first surface of said hub of said base actuator;
   wherein said at least one electrode area on said plate conductor is capable of being selectively electrified to cause at least a portion of said plate actuator to move generally parallel to the z-axis.

7. The piezoelectric actuator according to claim 6 wherein said first surface of said plate body further comprises a plurality of separate electrode areas, whereby at least one of said plurality of separate electrode areas is capable of being selectively energized to cause at least a portion of said plate body to expand or contract in the z-direction, whereby said plate body is capable of both linear displacement in the z-direction and rotational displacement with respect to the x–y plane.

8. The piezoelectric actuator according to claim 6 wherein said plate actuator further comprises a plurality of stacked plate bodies, and wherein said first surface of said plate bodies are attached to but insulated from an adjacent second surface of an adjacent plate body.

9. The piezoelectric actuator as defined in claim 1, wherein said base actuator has a cruciform shape with said limb members extending orthogonally outward therefrom.

10. The piezoelectric actuator as defined in claim 1, wherein said base unit is secured to but electrically isolated from the outer radial ends of said plurality of limb members.

11. The piezoelectric actuator as defined in claim 1, wherein said base unit is fabricated of a rigid, non-piezoelectric material.

12. The piezoelectric actuator as defined in claim 1, further comprising electronic circuitry connected to all of said electrically conductive material, said electronic circuitry providing electrical drive signals to selected ones of said electrically conductive material.

13. The piezoelectric actuator as defined in claim 12, wherein said electronic circuitry is responsive to feedback received from selected others of said electrically conductive material.

14. The piezoelectric actuator as defined in claim 13, wherein said electronic circuitry comprises control logic.

15. The piezoelectric actuator as defined in claim 13, wherein said electronic circuitry comprises a plurality of high voltage amplifiers.

16. The piezoelectric actuator as defined in claim 6, wherein additional piezoelectric actuators are stacked over said piezoelectric actuator.

* * * * *